US006933721B2

(12) United States Patent
Vavrek et al.

(10) Patent No.: US 6,933,721 B2
(45) Date of Patent: Aug. 23, 2005

(54) METHOD AND APPARATUS FOR ENHANCED FAT SATURATION DURING MRI

(75) Inventors: Robert M. Vavrek, Waukesha, WI (US); Ricardo Becerra, Waukesha, WI (US); Ceylan C. Guclu, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 32 days.

(21) Appl. No.: 10/738,692

(22) Filed: Dec. 17, 2003

(65) Prior Publication Data

US 2005/0134263 A1      Jun. 23, 2005

(51) Int. Cl.[7] ............................................. G01V 3/00
(52) U.S. Cl. ...................................... 324/309; 324/307
(58) Field of Search ............................... 324/309, 307, 324/318, 319, 300, 314, 322; 128/653

(56) References Cited

U.S. PATENT DOCUMENTS

| 4,993,415 | A | * | 2/1991 | Long .......................... 424/9.37 |
| 5,183,045 | A | * | 2/1993 | Takamura et al. .......... 600/422 |
| 5,339,033 | A |   | 8/1994 | Eilenberg et al. ........... 324/309 |
| 5,414,358 | A |   | 5/1995 | Eilenberg et al. ........... 324/309 |

* cited by examiner

Primary Examiner—Brij B. Shrivastav
(74) Attorney, Agent, or Firm—Joseph S. Heino; Patrick M. Bergin; Henry Policinski

(57) ABSTRACT

The present invention provides for a method for using a silicon dioxide ($SiO_2$) material that is equally effective in improving magnetic field homogeneity during MR imaging. The present invention further provides for using silicon dioxide in its granular state. The granular silicon dioxide can then be poured inside a flexible container and the flexible container can be formed to fit any contour of the body.

25 Claims, 3 Drawing Sheets

METHOD AND APPARATUS FOR ENHANCED FAT SATURATION DURING MRI

BACKGROUND OF THE INVENTION

The present invention relates to a method for improving field homogeneity during magnetic resonance imaging when the homogeneity has been degraded by local susceptibility. More specifically, the invention relates to a method of placing a material with a magnetic susceptibility similar to body tissue in proximity to a part of a patient's body being imaged with a magnetic resonance imaging system and then imaging that body part, whereby field homogeneity is improved such that a homogeneity sensitive protocol provides an improved image of the body part.

Magnetic resonance imaging, or MRI, is a method by which the location, size, and conformation of organs and other structures of the body may be determined. In the typical MRI system, a magnetic field is established across a body to align the spin axes of the nuclei of a particular chemical element, usually hydrogen, with the direction of the magnetic field. The aligned, spinning nuclei execute precessional motions around the aligning direction of the magnetic field. For the aligned, spinning nuclei, the frequency at which they precess around the direction of the magnetic field is a function of the particular nucleus which is involved and the magnetic field strength. The selectivity of this precessional frequency with respect to the strength of the applied magnetic field is very short and this precessional frequency is considered a resonant frequency.

In an ordinary MRI system, after the nuclei have been aligned or polarized, a burst of radio frequency energy at the resonant frequency is radiated at the target body to produce a coherent deflection of the spin alignment of the selected nuclei. When the deflecting radio energy is terminated, the deflected or disturbed spin axes are reoriented or realigned, and in this process radiate a characteristic radio frequency signal which can be detected by an external coil and then discriminated in the MRI system to establish image contrast between different types of tissues in the body. MRI systems have a variety of different excitation and discrimination modes available, such as free induction decay ("FID"), spin echo, and continuous wave, as are known in the art.

Two parameters are used to measure the response of the magnetized sample to a disturbance of its magnetic environment. One is T1 or longitudinal relaxation time, the time it takes the sample to become magnetized or polarized after being placed in an external magnetic field; the other is T2, the spin relaxation time, a measure of the time the sample holds a temporary transverse magnetization which is perpendicular to the external magnetic filed. Images based on proton density can be modified by these two additional parameters to enhance differences between tissues.

Hydrogen is usually selected as the basis for MRI scanning because of its prominent magnetic qualities. Hydrogen, having a single proton nucleus, is easily polarized. Further, hydrogen is abundant in water, a major component of the human body. Tissues that have a high content of water, and thus hydrogen and hydrogen protons, are deemed "protonated" and provide strong images during MRI. One disadvantage to the abundance of hydrogen in the human body, however, is that signal from tissues of little or no interest may obscure signal from more diagnostically relevant adjacent tissues.

The images formed in magnetic resonance imaging are really a converted visual display of the otherwise invisible radio waves emitted by protons (when scanning for hydrogen atoms) that are detected by the MRI pick-up coil. When scanning for hydrogen atoms, tissue areas which have no hydrogen atoms emit no radio waves, and thus the MR image of this tissue is displayed with no intensity, and appears black. Tissues that have a high hydrogen content, on the other hand, may emit a large amount of radio waves depending on the scanning criteria. Such signals are converted into a correspondingly bright visual display image. Normally, grey scale assignment, based upon the relative energy or signal intensities received from the tissues, is utilized in order that the user may more easily distinguish the various tissues and organs imaged. On these grey scale images, low or no signal is designated as black, and very high signals are assigned a lighter shade of grey or even white.

Occasionally, tissues that are in abundance and create a bright signal may overwhelm the signal emanating from less abundant and differently hydrogenated species or tissue. This may visually mask the latter tissue and obscure a disease process or anatomy. This decreases the sensitivity of MRI for certain disease processes and creates a problem for the diagnostician.

Various methods have been used in order to try and separate the signals coming from the various tissues of the body and thereby produce more distinct images. One such method involves nullifying the signal received from a certain tissue. This is done by utilizing spin echo and gradient echo presaturation pulse sequences based upon information about subtle differences in the precessional frequency of hydrogen atoms as they associate with fatty versus non-fatty tissues. For example, in order to improve the conspicuity of non-fatty tissues that lie in a background of a fatty tissue, the entire tissue is first subjected to a chemically specific saturation radio pulse. This preparatory pulse essentially affects the hydrogen atoms associated with the fat molecules. These pretreated hydrogen atoms have, in a sense, been briefly deactivated and are not able to emit a useful signal when the actual imaging portion of the pulse sequence commences. The MR image is then created with little or no contribution from the fatty tissue. The resultant image will show the non-fatty tissue against a dark background. This process is called chemically selective presaturation of fat or fat saturation.

The precessional frequency difference between fat and water is known as chemical shift and has a value of 3.5 parts per million (ppm) of the field strength. At a 1.5 T field strength, the 3.5 ppm chemical shift causes fat to precess 220 Hz slower than water. This fat saturation process is unreliable if the inhomogeneity obscures the precessional difference between fat and water. A water tissue in an inhomogeneous field 220 Hz lower than the main field strength is difficult to distinguish from a fat tissue in the main field strength which is precessing 220 Hz slower. Because the precession frequency differences between the fatty and non-fatty tissues are very minute, the homogeneity must be very precise or non-fatty tissues are inadvertently variably saturated themselves. This problem is further compounded by the fact that the local magnetic environment of tissues tends to change based upon their position relative to the coil; position in the magnetic bore; and position with respect to organs or tissues with different magnetic susceptibilities (e.g. tissue next to bone or tissue next to air). Not only is the immediate magnetic environment important, but also the actual geometry of the organ or body part plays a major role in determining the fatty tissue's likelihood of being nullified with the fat saturation technique.

Further, interpretive problems can arise in several ways. First, if the fat is not saturated effectively, then pathology can be obscured. Second, if the fat is saturated in only portions of the body part being imaged, then the areas not saturated may be misinterpreted as pathologic tissue. Third, drastic alteration in geometry and magnetic susceptibility which naturally occur in the neck, shoulders and ankle, for example, can lead to inappropriate saturation of non-fatty tissues which are the subject of the examination.

One method occasionally used to improve magnetic field homogeneity by addressing the above stated limitation of this technique involves placing water bags around the body part being scanned. This technique is useful in that there is improvement in the local homogeneity and hence in the quality and reliability of the fat saturation technique. This is based on effectively changing the geometry of the body part. The bags must also conform closely to the body so as to eliminate or minimize any air gap between the bag and the body, referred to as the tissue-air interface.

Water, however, is highly protonated and creates a correspondingly bright signal surrounding the fat site. The bright background is a serious disadvantage for this procedure because it is distracting and counteracts the improved visualization produced by using water-filled bags with fat saturation sequences. It also causes a pseudo increase in the intensity dynamic range of the display device, leading to poor contrast in the pathologically relevant part of the image.

It has also been shown that fluorocarbons which have a magnetic susceptibility similar to that of human tissue, improve fat saturation when they are placed next to tissue being scanned using MRI. In particular, fluorocarbon materials containing little or no hydrogen, when placed around a body part being scanned, effectively eliminate the skin-air interface, eliminate magnetic susceptibility differences, dramatically improve the fat saturation efficacy, and add no signal of their own to the final image.

Unfortunately, fluorocarbons that are acceptable for use in the MRI imaging field are generally very expensive. Some forms of fluorocarbons have very low viscosity and will leak out of any enclosure rapidly and cause a slippery mess. Slippery fluid on the exterior of the container also prevents adhesion, thus making the enclosures difficult to seal initially and difficult to repair in the event of a puncture. Also, material options for containing fluorocarbons are limited because, in addition to proton imaging, many high field scanners also do multinuclear spectroscopy. Multinuclear spectroscopy is a procedure in which data is collected from nuclei other than protons (Hydrogen). One of the nuclei is Fluorine. Therefore, the presence of perflourocarbon would be very disruptive to Fluorine spectroscopy.

BRIEF SUMMARY OF THE INVENTION

The present invention provides for a method for using a Silicon Dioxide ($SiO_2$) material that is equally effective in improving magnetic field homogeneity during MR imaging. The present invention further provides for using silicon dioxide in its granular state. The granular silicon dioxide can then be poured inside a flexible container and the flexible container can be formed to fit any contour of the body.

The silicon dioxide employed in the present invention is well-suited for use in MR imaging because it does not generate an MR signal and has diamagnetic properties similar to water. Silicon dioxide also has a dielectric constant that minimizes interaction with the RF field. Lastly, silicon dioxide is not electrically conductive, thus preventing any possible eddy currents.

The present invention also provides for use of other granular materials having properties similar to silicon dioxide. For example, $Al_2O_3$ and MgO also have similar diamagnetic properties and can be used in powder form. Powder form is ideal so that the powder conforms to body parts. Powder form is also ideal in that it is easier to clean up after a spill.

Other compounds, including protonated compounds, which do not have protons that resonate at the same frequency as the tissue to be imaged would also be suitable for improving fat saturation. Such compounds are useful in all physical states including liquid, solid, particulate, or gel.

Therefore, a preferred embodiment of the present invention comprises a device for improving magnetic field homogeneity during magnetic resonance imaging comprising a material having magnetic properties similar to human tissue packaged in a container. The present invention provides for a material that, when used in fat saturation techniques, enhances fat saturation and, if used in spectroscopy, enhances spectroscopy. More importantly, while the example cited in this disclosure is that of fat saturation, the invention is applicable to any homogeneity sensitive application.

Preferably, the fat saturation enhancing material is a silicon dioxide, aluminum oxide, or magnesium oxide and is packaged into bags. In one form, these bags are thin and flexible. This allows the bags to contour themselves to the skin surface of the patient so as to eliminate the skin-air interface. These bags are preferably stackable so that they can be used in areas of varying anatomical structure and so that the optimum cylindrical scanning configuration may be obtained.

In yet another embodiment, a bag is incorporated into an outer rigid or semi-rigid shell structure. In this form, a bag having a hollow portion for introduction of a body part is attached to the inside of the outer shell. Magnetic field homogeneity enhancing material is placed inside the bag in order that the field homogeneity enhancing material may be placed in close proximity to a body part positioned within the hollow portion of the bag and shell.

In order to optimize MR imaging conditions, the outer shell is shaped such that its outer surface is cylindrical. Further, the hollow portion of the bag into which the body part is inserted is shaped such that the magnetic field homogeneity improvement material is in close proximity to the portion of the body which is being imaged. For example, the hollow portion of the bag may be shaped as a glove for the introduction and MR imaging of a hand, or may be cylindrical to allow the introduction and imaging of a leg or arm. Lastly, the bag is selectively fillable. In this manner, the bag may be drained of the magnetic field homogeneity enhancing material to allow a portion of a patient's body to be positioned within the hollow portion of the bag. Then, the bag may be filled with the magnetic field homogeneity enhancing material to a point at which the bag is in complete contact with the portion of the body to be imaged. This ensures that the magnetic field homogeneity enhancing material completely surrounds the area being scanned.

In another embodiment, the bag containing the magnetic field homogeneity enhancing material surrounds a flexible coil for MR imaging. Flexible coils are well known in the MR imaging field and increase the quality of images by transmitting and/or receiving more homogenous signals in the tissue because they wrap around the body part to be imaged. Furthermore, flexible coils efficiently image many body parts of different sizes and geometries, unlike the limited uses of rigid, dedicated coils. Wrap-around imaging is especially useful for geometrically changing anatomic body areas such as the head, wrist, neck, shoulder, breast, knee, and ankle. A disposable flexible sheath surrounding the coil may be used to protect the coil from contamination. By enclosing a flexible coil within a flexible bag containing magnetic field homogeneity enhancing material, the combination would further enhance image quality by eliminating air between the coil and the patient. Thereupon additional bags can be placed on the coil to correct for geometric variations in the body.

In another embodiment, which can be understood with reference to the figures, a flexible MR coil forms at least a portion of the outer surface of the bag containing a magnetic field homogeneity enhancing material. The coil attached to the bag would be flexible, providing direct, wrap-around contact with the patient during imaging. Thus resolution would be improved, especially for geometrically changing anatomic body areas as discussed above.

In another embodiment, a MR imaging coil within a bag containing magnetic field homogeneity enhancing material is inserted into a body cavity for imaging the surrounding tissue. Such endo-cavity coils would be rigid, semi-rigid, or flexible MR coils contained within a flexible bag holding the magnetic field homogeneity enhancing material. Endo-cavity coils would be used, for example, to image the rectum, vagina or oral cavity. The endo-cavity coil would increase the quality of the cavity image for the reasons presented above.

In another embodiment, the present invention comprises a method for improving magnetic field homogeneity during magnetic resonance imaging. Field homogeneity can be improved by providing a fat saturation enhancing material, such as silicon dioxide, magnesium oxide, or aluminum oxide, in a container, placing the container on or around a part of a patient's body to be imaged, and then imaging that body part with an MRI system. Preferably, the fat saturation enhancing material is a silicon dioxide, magnesium oxide, or aluminum oxide. Alternatively, other compounds that have protons that do not resonate at the same frequency as the tissue to be imaged may be used. More preferably still, the container is placed so that the container and the body part to be imaged together minimize magnetic field inhomogeneity in the body part.

These and other aspects of the invention will become apparent from a study of the following description in which reference is directed to the following drawings.

DETAILED DESCRIPTION

Figure 1:
FIG. 1 is a map of magnetic field homogeneity under imaging conditions.

Now referring to the drawings in detail wherein like numbered elements refer to like elements throughout, FIG. 1 shows a map of magnetic field inhomogeneity. In a homogeneous field, the cross section of the person would be a uniform gray color. However, as shown, the shading varies from black to white due to the local inhomogeneity caused by the curvature of the neck. The dashed line from back of the torso to the back of the head is used to show the amount of inward curvature of the neck. Magnetic flux density is a vector quantity, defined by both a magnitude and a direction. The direction of the magnetic flux density in the magnet bore center is aligned parallel with the cylindrical bore magnet, usually annotated in images as the Superior-Inferior direction. From the torso to the head, the direction of the magnetic flux density lines are distorted due to the change in geometry in the neck region.

Figure 2:
FIG. 2 is a map of magnetic field homogeneity under imaging condition wherein the present invention is employed.

FIG. 2 shows a map of magnetic field inhomogeneity wherein the image has been taken using the present invention. When the void behind the neck is filled with a material with nearly the same magnetic properties as human tissue, the magnetic flux density lines do not see a drastic change in geometry and are minimally affected. In other words, the magnetic field is substantially more uniform as indicated by the more uniform shading in the neck region. As people vary in size and shape, the silica is in a pliable container or bag. A variety of bag shapes and sizes could be provided to allow just the right amount of fill to be applied for each patient.

Fatty tissue is highly protonated and therefore emits a strong signal when scanned, and thus appears relatively bright on the MR image. This bright signal may mask less abundant, non-fatty hydrogenated tissues that are mixed with the fat. It is the non-fatty tissue which is frequently the area of greatest interest on the MR examination, and it can be obscured by the overwhelming signal from the abundant fat.

Magnetic resonance imaging is enhanced when the fatty tissue is "saturated." When this occurs, the fatty tissue emits no signal and appears relatively darker or even black on the final image. This provides good contrast for other tissues mixed in with the fat.

When compounds low in, or lacking, hydrogen, are placed adjacent to the tissue being scanned, these compounds are effective in improving fat saturation. The compounds are low in hydrogen, and thus little or no radio wave energy is emitted from these compounds during MRI. Therefore, the corresponding MR image of this material is dark or black, providing an effective contrast image. Further, these compounds have susceptibility similar to that of human tissue. Lastly the compound should be something that is solid and in a granular or powder form at room temperature.

In general, materials having a magnetic behavior similar to that of human tissue, having a low hydrogen content, or, in other words, being non-protonated or minimally protonated are suitable for use for fat saturation. Other properties are also helpful. For example, the material should have a low dielectric constant such that it does not interact with the RF field. The material should also be electrically nonconductive.

The inventors have determined that silicon dioxide, magnesium oxide and aluminum oxide satisfy these requirements. Their properties minimize disruption of the magnetic flux when used as discussed above. This feature aids in improving magnetic field homogeneity, and therefore, improving imaging because when the chemicals are placed in contact or close proximity with the surface of the patient's body, the problems associated with MRI scanning at the skin-air interface are reduced or eliminated. In other words, because there is not a skin-air interface, the MR imaging machine achieves fat saturation more effectively.

These materials also have the advantage of being easily packageable because they are in a solid state at room temperature. Preferably, the material either exists in a fine powdered form or can be reduced to a fine powdered form. This permits the materials to be package in containers that will conform to a patient's body to eliminate the skin-air interface.

Figure 3:
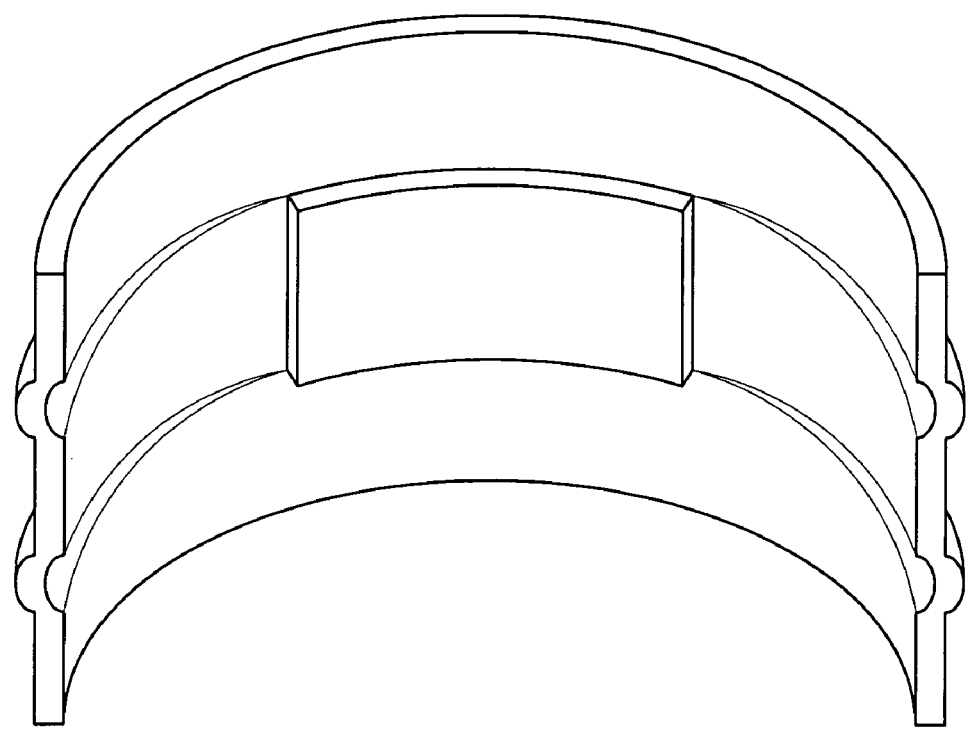
FIG. 3 is a perspective view of one embodiment of the present invention.
Figure 4:
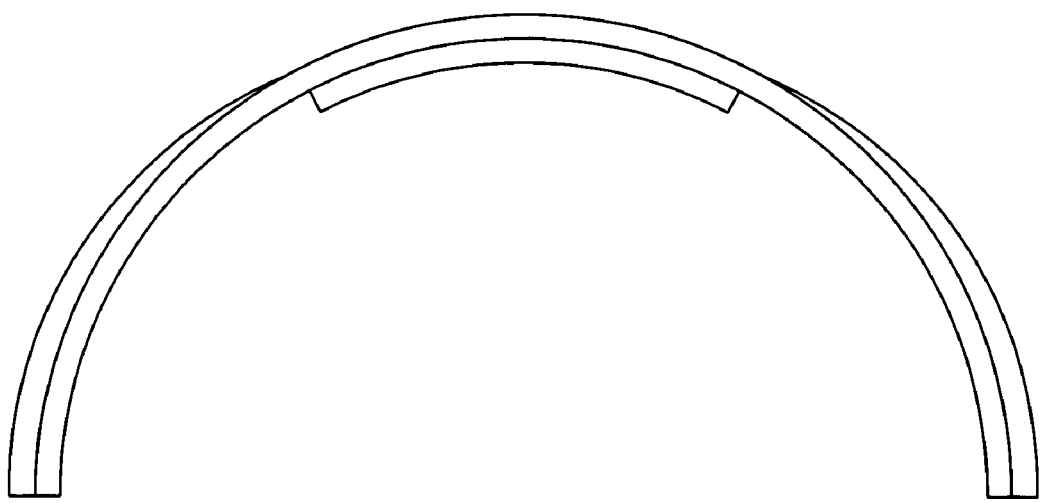
FIG. 4 is a perspective view of a second embodiment of the present invention.

As illustrated in FIGS. 3 and 4, it is desirable to a make use of a powdered or granular material placed in bags or other suitable containers. Obviously, FIGS. 3 and 4 show only one embodiment of what could be limitless embodiments. The bags are preferably made of a material that is relatively thin, yet durable and low in cost. Also, the bags should not be reactive with the material in any way and yet be compatible with magnetic resonance. A magnetic resonance compatible material would ideally emit no signal, be non-conductive, and not disrupt the static, gradient, and RF fields. As shown in the figures, it is preferable to make thin bags.

The bags can be, formed in any number of ways including hot bar sealing, impulse, or RF. Frequently, and as shown in FIGS. 2 through 4, it is frequently required to use the bags in conjunction with one another, as shown in FIGS. 3 and 4. The bags are preferably stackable and/or linkable. The bags may also employ hook and pile fasteners (such as VELCRO® brand fastener) or adhesive on their surfaces to provide an effective means for securing the bags together. A plurality of smaller bags may also be enclosed in a coverlet in order to secure the bags.

Where the bags are used in areas of fairly uniform body surface, such as the stomach or thigh, the flexibility of the bags allows them to easily conform to the body surface. In this fashion the tissue-air interface is effectively eliminated. In areas of the body where the anatomical structure is more varied, the bags are shaped to conform to the particular area. For example, it is difficult to place a flat, rectangular or square bag between the top of the back and the skull around the neck. Further, any bag may be fitted with straps, ribs, bottom seals, or other attachment means in order to secure the bags to the patient. Such attachment means may include Velcro® or adhesive, or other means known in the art which do not interfere with the image during the MR examination.

The bags are also designed such that when placed around the area being examined, the cross section of the image enhancing material, in conjunction with the body, can be made substantially cylindrical. As stated above, MRI machines have difficulty imaging and achieving fat saturation or nullification in areas where the body has a changing anatomical cross section. Preferably, for the best imaging and most efficient fat saturation, the magnetic flux density in the area being scanned is minimally disrupted, hence improving magnetic field homogeneity. Unfortunately, several areas of the body do not have this desired geometry as shown in FIGS. 1 and 2.

In order to enhance imaging and improve fat saturation, it is desirable that the fat saturation enhancing material, when placed on the body, aid in creating improved homogeneity. This may be accomplished by forming bags which contain the material in the desired form. For example, bags can be custom designed to conform to specific areas of the body, or one "convoluted" bag might be used at various anatomical positions.

Due to the complexity and variability of the human body, it is impossible to anticipate every possible use for the present invention. The invention provides a means to influence local homogeneity and a variety of methods of containing and using the homogeneity influencing substance. The shape, size, and quantity of bags for a particular anatomical region can be determined from MRI field homogeneity images. Kits for anatomical regions containing an assortment of bags to cover the shape and size variation in the human population is another possible embodiment.

Although the invention has been described in detail in terms of certain preferred embodiments, other embodiments that are apparent to those of ordinary skill in the art are also within the scope of this invention.

What is claimed is:

1. A method of improving magnetic field homogeneity during magnetic resonance imaging, comprising:
    placing magnetic field homogeneity enhancing material selected from the group consisting of: silicon dioxide, magnesium oxide and aluminum oxide in a container that is placed against a portion of tissue to be imaged with a magnetic resonance imaging system;
    imaging said tissue with a magnetic resonance imaging system.

2. The method of claim 1, wherein said container is flexible.

3. The method of claim 2 wherein said container is formed from thin sheets.

4. The method of claim 3 wherein said container is a bag.

5. The method of claim 1 wherein the field homogeneity enhancing material is refined to an extremely fine powder.

6. The method of claim 1 wherein the field homogeneity enhancing material is a non-protonated or minimally protonated material.

7. The method of claim 6 wherein the field homogeneity enhancing material is a compound in which the protons of the material do not resonate at the same frequency as the protons imaged by the magnetic resonance imaging system.

8. The method of claim 1 wherein the container is surrounded by a flexible magnetic resonance imaging coil.

9. The method of claim 1, additionally comprising the step of stacking a plurality of containers about the part of the body of a patient about to be imaged.

10. The method of claim 9 wherein said plurality of containers are joined to each other in order to secure said containers at or around said part of the body.

11. The method of claim 1 wherein said placing step comprises placing said container so that said container concentrically surrounds said part of the body.

12. A device for improving the ability of a magnetic resonance imaging system to produce a homogeneous magnetic field, comprising:
    a container to be placed in contact with a body part and to conform to said body part to be imaged with MRI, to minimize the body-air interface; and
    a solid magnetic field homogeneity enhancing material selected from the group consisting of: silicon dioxide, magnesium oxide and aluminum oxide in said container.

13. The device of claim 12, wherein said container is flexible.

14. The device of claim 13, wherein said container is formed from thin sheets.

15. The device of claim 14 wherein said container is a bag.

16. The device of claim 12 wherein the magnetic field homogeneity enhancing material is refined to an extremely fine powder.

17. The device of claim 16 wherein the magnetic field homogeneity enhancing material is a material selected from the group consisting of: silicon dioxide, magnesium oxide and aluminum oxide.

18. The device of claim 12 wherein the magnetic field homogeneity enhancing material is a non-protonated or minimally protonated material.

19. The device of claim 18 wherein the magnetic field homogeneity enhancing material is a compound in which the protons of the material do not resonate at the same frequency as the protons imaged by the magnetic resonance imaging system.

20. The device of claim 12 wherein the container is surrounded by a flexible magnetic resonance imaging coil.

21. The device of claim 12 wherein effective improvement of magnetic field homogeneity requires the use of a plurality of containers about the part of the body of a patient about to be imaged.

22. The device of claim 21 wherein said plurality of containers are joined to each other in order to secure said containers at or around said part of the body.

23. The device of claim 12 wherein said placing step comprises placing said container so that said container concentrically surrounds said part of the body.

24. A method of improving magnetic field homogeneity during magnetic resonance imaging, comprising:

placing magnetic field homogeneity enhancing material, said magnetic field homogeneity enhancing material being a material selected from the group consisting of silicon dioxide, magnesium oxide and aluminum oxide in a powdered form, in a conformable container that is placed against a portion of tissue to be imaged with a magnetic resonance imaging system;

imaging said tissue with a magnetic resonance imaging system.

25. A device for improving magnetic field homogeneity during magnetic resonance imaging, comprising:

a conformable container that is placed against a portion of tissue to be imaged with a magnetic resonance imaging system;

a magnetic field homogeneity enhancing material, said magnetic field homogeneity enhancing material being a material selected from the group consisting of silicon dioxide, magnesium oxide and aluminum oxide in a powdered form, in imaging said tissue with a magnetic resonance imaging system.

\* \* \* \* \*